(12) United States Patent
Mabuchi (10) Patent No.: US 11,350,049 B2
(45) Date of Patent: May 31, 2022

(54) DARK CURRENT CALIBRATION METHOD AND ASSOCIATED PIXEL CIRCUITRY

(71) Applicant: OMNIVISION TECHNOLOGIES, INC., Santa Clara, CA (US)

(72) Inventor: Keiji Mabuchi, Los Altos, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/087,415

(22) Filed: Nov. 2, 2020

(65) Prior Publication Data

US 2022/0141406 A1  May 5, 2022

(51) Int. Cl.
| | |
|---|---|
| H04N 5/361 | (2011.01) |
| H01L 27/146 | (2006.01) |
| H01L 27/148 | (2006.01) |
| H04N 5/355 | (2011.01) |
| H04N 5/378 | (2011.01) |

(52) U.S. Cl.
CPC ....... *H04N 5/361* (2013.01); *H01L 27/14612* (2013.01); *H01L 27/14643* (2013.01); *H01L 27/14831* (2013.01); *H04N 5/3559* (2013.01); *H04N 5/35581* (2013.01); *H04N 5/378* (2013.01)

(58) Field of Classification Search
CPC .. H04N 5/361; H04N 5/35581; H04N 5/3559; H04N 5/378; H04N 5/23245; H04N 5/355; H04N 5/359; H04N 5/3591; H04N 5/3592; H04N 5/365; H04N 5/3651; H04N 5/36963; H04N 5/37452; H01L 27/14612; H01L 27/14643; H01L 27/14831; H01L 27/14654; H01L 27/14656

USPC .......................................................... 348/243
See application file for complete search history.

(56) References Cited

U.S. PATENT DOCUMENTS

| | | | | |
|---|---|---|---|---|
| 6,061,092 | A  * | 5/2000 | Bakhle | H04N 5/232 348/E5.042 |
| 6,144,408 | A  * | 11/2000 | MacLean | H04N 9/04521 348/241 |
| 9,426,394 | B2 | 8/2016 | Kim et al. | |
| 9,826,178 | B2 * | 11/2017 | Beck | H04N 5/35518 |
| 2004/0263648 | A1 * | 12/2004 | Mouli | H04N 5/367 348/243 |
| 2013/0188085 | A1 * | 7/2013 | Shim | H01L 27/14612 348/333.08 |

(Continued)

*Primary Examiner* — Albert H Cutler
(74) *Attorney, Agent, or Firm* — Christensen O'Connor Johnson Kindness PLLC (57) ABSTRACT

Image sensors capable of dark current calibration and associated circuits are disclosed herein. The method for calibrating dark current includes acquiring at least one dark current frame of a first plurality of pixels of a pixel array of the image sensor. The dark current frame contains readings of individual dark currents for the corresponding pixels obtained during an exposure period when a transistor is turned on disabling the photodiode. The method also includes acquiring at least one normal frame of a second plurality of pixels of the pixel array of the image sensor. The normal frame contains readings of individual signals for the corresponding pixels obtained during the exposure period when the transistor is turned OFF. The method includes subtracting the at least one dark current frame from the at least one normal frame.

25 Claims, 9 Drawing Sheets

(56) References Cited

U.S. PATENT DOCUMENTS

2021/0243393 A1* 8/2021 Yonemoto ............ H04N 5/3559
2021/0289154 A1* 9/2021 Johnson ................ H04N 5/353

* cited by examiner

DARK CURRENT CALIBRATION METHOD AND ASSOCIATED PIXEL CIRCUITRY

BACKGROUND INFORMATION

Field of the Disclosure

This disclosure relates generally to image sensors, and particularly but not exclusively, relates to pixel cells having an improved dark current performance.

Background

CMOS image sensors (CIS) have become ubiquitous. They are widely used in digital still cameras, cellular phones, security cameras, as well as medical, automobile, and other applications. An image sensor operates in response to image light coming from an external scene and being incident upon the image sensor. An image sensor includes an array of pixels having photosensitive elements (e.g., photodiodes) that absorb a portion of the incident image light, in response generating corresponding electrical charges. The electrical charge of an individual pixel may be measured as an output voltage of its photosensitive element. In general, the output voltage varies as a function of intensity and duration of the incident light. The output voltage of individual photosensitive elements is used to produce a digital image (i.e., image data) representing an external scene.

Image sensor technology has continued to advance at a great pace. The demands of higher resolution and lower power consumption have encouraged further miniaturization and integration of these devices having high dynamic range and low light sensitivity. Miniaturization of the pixel cells makes them susceptible to dark currents, i.e., electrical currents that exist in absence of the excitation light or in presence of very low levels of the excitation light. Dark current affects the accuracy and quality of the image taken by image sensor. In some scenarios, dark current may even cause white pixels, i.e., occurrence of the pixels that are saturated or close to being saturated. Therefore, systems and methods are needed for improved handling of dark current.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses and methods directed to improved handling of dark currents and white pixels in an image sensor are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the present technology are directed to reducing impact of dark current (DC) on the accuracy of pixel reading. Dark currents accumulate at pixels' floating diffusions (FDs) even in absence of the excitation light or in presence of very low levels of the excitation light. In some embodiments, during the exposure period, photodiodes accumulate charges generated by the light exposure at floating diffusion (FD1) with a high conversion gain (HCG) and at floating diffusion (FD2) for a low conversion gain (LCG). The accumulated charges are determined during the HCG and LCG readouts, collectively constituting a dual conversion gain (DCG) readout.

Generally, it is always possible to reset the FDs, i.e., removing charges in the FDs by a reset (RST) transistor of the pixel circuitry that selectively couple the respective FD to a voltage source e.g., power supply. However, due to a specific order of readouts of the FDs in the DCG data readout, the FD that is connected to the high conversion gain (HCG) part of the data readout is read out prior to reading out the corresponding data of the LCG FD. Therefore, turning on the RST transistor prior to reading the LCG FD would result in deleting photogenerated charge information stored at the LCG FD. On the other hand, even turning on the RST transistor right after reading the reset value of the HCG FD would still result in a loss of information about the magnitude of the dark current that accumulated in through the integration period, resulting in an incorrect estimate of the dark current accumulated at the LCG FD.

In some embodiments, an estimate of a dark current (DC) pixel frame may be obtained by acquiring the value of dark current in the pixels of an entire pixel frame, separate from acquiring signal values of the pixels in the frame. This DC frame may then be used as a representative of the intensity of the dark current for the subsequently-acquired frames for as long as the conditions that determine intensity of the dark current remain reasonably unchanged (e.g., relatively short time has elapsed, no significant temperature differences from frame to frame, etc.). The pixel values from the DC frame may be subtracted from the corresponding pixel signal values of the normal frames to account for the dark current. This subtraction may also be referred to as calibration or adjustment. In some embodiments, the DC frame may be every Nth frame in a sequence of frames in a video stream. In other embodiments, new DC frame may be taken at a predetermined change of temperature or after a predetermined time.

In some embodiments, a portion of pixel frame may be used as a DC frame. For example, every other row of pixels may be used as a DC row to be subtracted from image (also referred to as normal or regular) rows that are used for image readout. In other embodiments, one or more dedicated columns may represent DC columns. Such division of the entire frame into the DC portion and image portion may be especially suitable for the scenes requiring only a low resolution.

Figure 1:
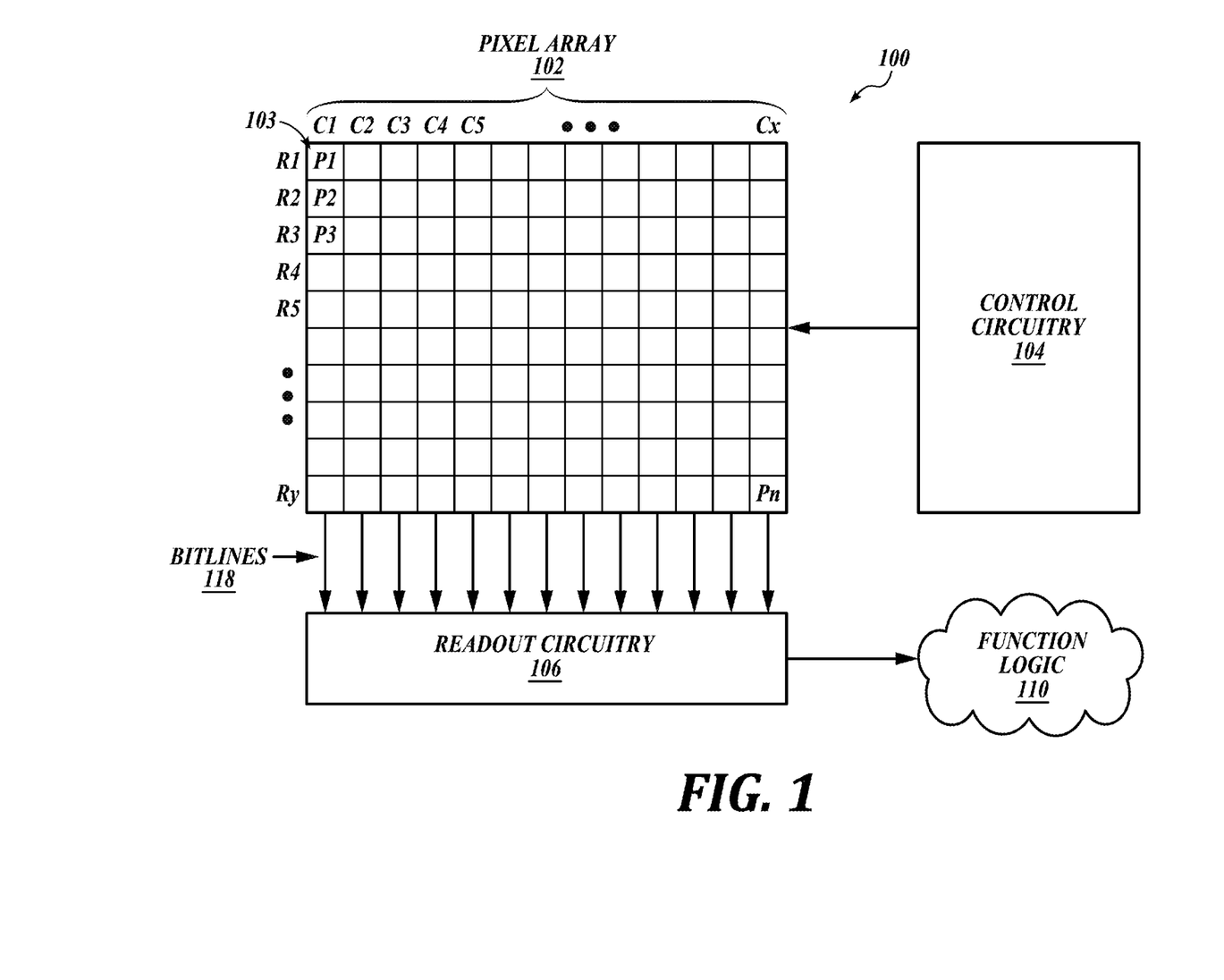
FIG. 1 illustrates an imaging system according to an embodiment of the present disclosure.

FIG. 1 illustrates an example imaging system 100 in accordance with an embodiment of the present disclosure. The imaging system 100 includes a pixel array 102, a control circuitry 104, a readout circuitry 106 and a function logic 110. In one example, the pixel array 102 is a two-dimensional (2D) array of photodiodes or image sensor pixels 103 (e.g., pixels P1, P2 . . . , Pn). In different embodiments, two or more image sensor pixels 103 may be grouped to a plurality of pixel cells. As illustrated, the photodiodes are arranged into rows (e.g., rows R1 to Ry) and columns (e.g., column C1 to Cx). In operation, the photodiodes acquire image data of a scene, which can then be used to render a 2D image of person, place, object, etc. However, in other embodiments the photodiodes may be arranged into configurations other than rows and columns.

In an embodiment, after each pixel 103 in the pixel array 102 acquires its image charge, the image data is read out by the readout circuitry 106 via bitlines 118, and then transferred to a function logic 110. In an embodiment, the readout image data of each pixel 103 collectively constitute as an image frame. The readout of dark current data of each pixel 103 collectively constitute as a dark current (DC) frame. In various embodiments, the readout circuitry 106 may include signal amplifiers, analog-to-digital (ADC) conversion circuitry and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 103 and the readout of image data from the readout circuitry 106. The function logic 110 may include a digital processor, for example. In an embodiment, the readout circuitry 106 may read one row of image data at a time along readout column lines (bitlines 118) or may read the image data using a variety of other techniques, such as a serial readout or a full parallel readout of all pixels simultaneously.

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within the pixel array 102 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 104 may be configured to control each of pixels 103 to perform the acquiring operations of one or more dark current pixel frames for image calibration and normal image frames.

In one embodiment, readout circuitry 106 includes analog-to-digital converters (ADCs), which convert analog image data received from the pixel array 102 into a digital representation. The digital representation of the image data may be provided to the function logic 110. In some embodiments, the data transmission circuitry 108 may receive the digital representations of the image data from the ADCs in parallel and may provide the image data to the function logic 110 in series.

In different embodiments, imaging system 100 may be included into a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
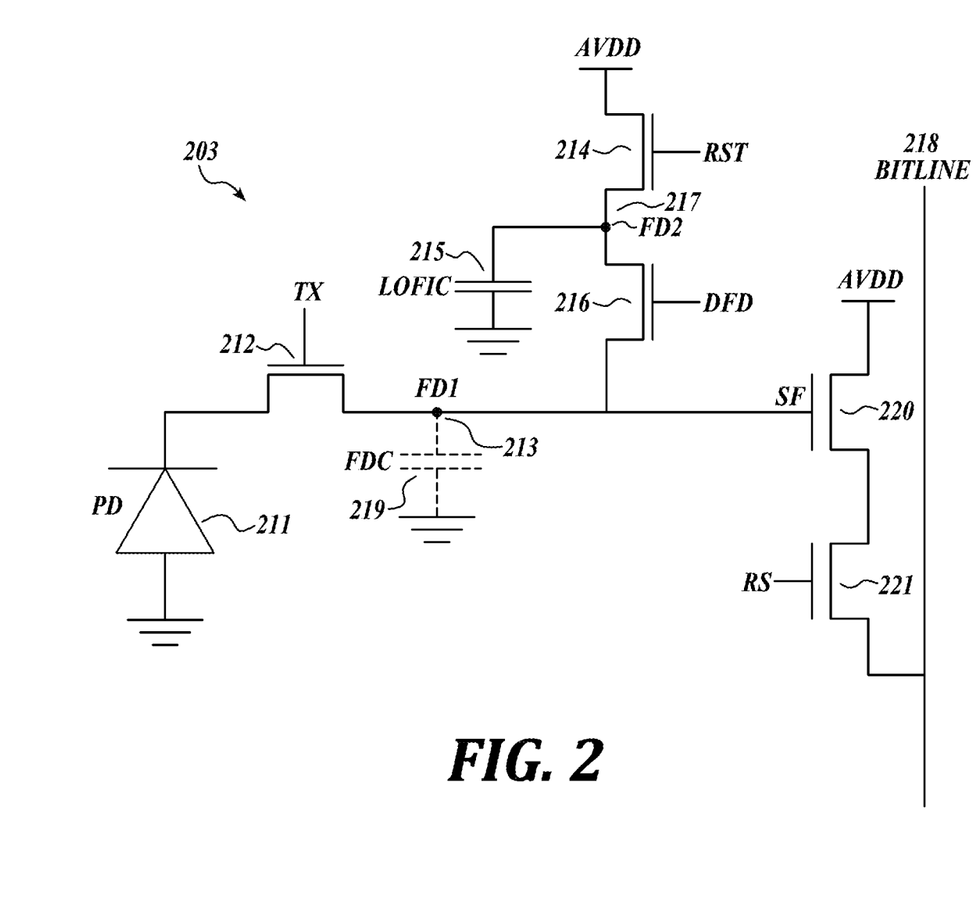
FIG. 2 is an illustrative schematic of a pixel in accordance with an embodiment of the present disclosure.

FIG. 2 is an illustrative schematic of a pixel 203 in accordance with an embodiment of the present disclosure. The pixel 203 may be coupled to a bitline 218, e.g., a readout column that provides image data to readout circuitry, such as the readout circuitry 106. In operation, the pixel 203 may receive control signals from control circuitry, such as the control circuitry 104, to control the operation of various transistors of the pixel 203. The control circuitry may control the operation of the transistors in desired sequences with relative timing that assures an ordered read out of the image data.

The illustrated embodiment of the pixel 203 includes a photodiode (PD) 211, a floating diffusion (FD1) 213 connected to a capacitor (FDC) 219, a transfer transistor 212, a dual floating diffusion (DFD) transistor 216, a floating diffusion (FD2) 217 connected to a lateral overflow integration capacitor (LOFIC) 215, a reset (RST) transistor 214, a row select (RS) transistor 221, and a source follower (SF) transistor 220. The transfer (TX) transistor 212, which may also be referred to as a transfer gate 212, is coupled between the photodiode PD 211 and the floating diffusion FD1 213. The TX transistor 212 operates based on a TX control signal on its gate terminal. While the floating diffusion FD1 213 is depicted as connected to a capacitor FDC 219 that is in turn connected to ground, the combination of FD1 213 and FDC 219 may also be collectively referred to as a floating diffusion.

The RST transistor 214 may be coupled to a reference voltage AVDD (e.g., 2.5V-3.3V) and may receive a reset control signal on its gate terminal. The additional capacitance LOFIC 215 may be selectively coupled between ground and floating diffusion node FD2 217. The DFD transistor 216 may be coupled between FD1 213 and FD2 217, and further configured to receive a DFD control signal on its gate terminal to modulate conversion gain of pixel cell 203. Further, a gate terminal of the SF transistor 220 is coupled to the floating diffusion node FD1 213. The source/drain terminals of the SF transistor 220 are coupled between the reference voltage AVDD and the RS transistor. The RS transistor 221 may be coupled between the bitline 218 and the SF transistor 220.

In operation, the TX transistor 212 receives gate signal to enable charge transfer from the PD 211 to the floating diffusion FD1 213. In general, the amount of charge transfer depends on the light exposure of the PD 211 and operation of the pixel 203. The capacitor FDC 219 is illustrated as coupled to ground. In some embodiments, the FDC 219 may be formed by the metallization that is present in the physical layout of the device.

In some embodiments, LOFIC 215 may increase the storage, e.g., capacitance, of the floating diffusion FD2 217. For example, in response to high intensity illumination, the photodiode PD 211 may generate more charge than the floating diffusion FD1 213 can store. The extra charges (overflow charges) may be stored by the LOFIC 215. In general, the FDC 219 has a smaller capacitance than the LOFIC 215. In some example, the LOFIC 215 may be coupled to receive a biasing voltage adjusting the capacitance of LOFIC 215 to store charges from PD 211 during operation of the HDR CMOS image sensor. Therefore, the floating diffusion FD1 213 is read in conjunction with the high conversion gain (HCG) part of the data readout, for example during low light detection, while the floating diffusion FD2 217 and floating diffusion 213 are read out in conjunction with the low conversion gain (LCG) part of the readout, for example during bright light detection. Collectively, HCG and LCG readouts constitute a dual conversion gain (DCG) data readout for realizing high dynamic range imaging.

In some embodiments, operation of the RST transistor 214 and the DFD transistor 216 resets the floating diffusion FD2 217 to a high voltage that represents a dark state, because photogenerated electrons, when transferred to the floating diffusion FD2 217, decrease the voltage thereof proportionally to the amount of the photogenerated charges accumulated in the floating diffusion FD2 217. To reset the floating diffusion FD1 213, both the RST transistor 214 and the DFD transistor 216 are enabled (e.g., turned on) by their respective gate signals coupling the floating diffusion FD1 213 to reference voltage AVDD and remove residues charges in floating diffusion FD1 213. In other embodiments, the RST transistor 214 may be turned on in an ON state, while the DFD transistor remains in OFF state, hence resetting the floating diffusion FD2 217, but not resetting the floating diffusion FD1 213. It is observed that LOFIC 215 may collect charges that are generated in absence of light (also referred to as dark current noise) during an exposure period affecting image signal readout, however, in operation, if resetting floating diffusions FD1 213 and FD2 217 with the reset transistor 214 to remove accumulated dark current before image charge readout, photogenerated charges that already being stored in LOFIC 215 would be drain out resulting in signal loss.

Figure 3A:
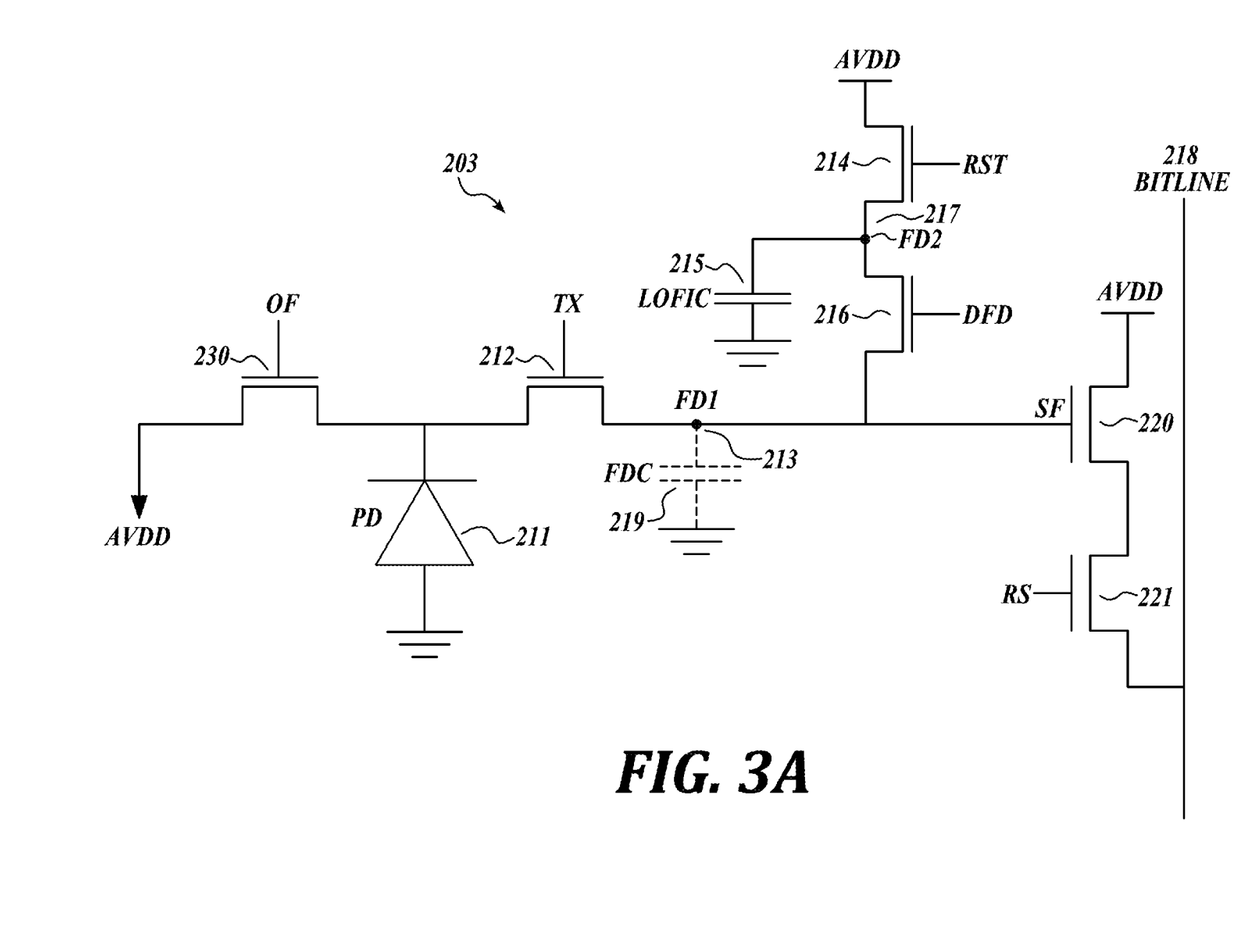
FIG. 3A is an illustrative schematic of a pixel in accordance with another embodiment of the present disclosure.

FIG. 3A is an illustrative schematic of a pixel in accordance with another embodiment of the present disclosure. The illustrated schematics is similar to that described in conjunction with FIG. 2 above. In the illustrated embodiment, an overflow (OF) transistor 230 is added to the pixel 203. The OF transistor 230 may be controlled to selectively couple a cathode of the PD 211 to a source of voltage, e.g., the AVDD voltage. In an embodiment, the AVDD voltage ranges from 2.5V to 3.3V. In embodiments, a drain of the OF transistor 230 is coupled to the AVDD voltage and a source of the OF transistor 230 is coupled to a cathode of the PD 211. In some embodiments, the AVDD voltage is supplied from a power line to the drain of the OF transistor 230. When the OF transistor is in the ON state, the output of the PD 211 is coupled to the AVDD voltage, therefore draining the charges generated by the PD 211. As a result, while the OF transistor remains in the ON state, the charges at the FD1 and FD2 correspond to dark current (DC) charges collected within the pixel 203. Accordingly, an entire DC frame may be assembled by repeating the above process for every pixel 203 in the pixel array 102 through suitable control operations of the row select (RS) transistor 221 to read out dark current level associated with each pixel 203. The resulting DC frame may be subtracted from the subsequently acquired regular (normal) image frames as a representative of the per-pixel dark current for given time, temperature or exposure conditions as dark current level associated with each pixel varies exposure time, operating temperature, and/or ageing. The subtraction may be referred to as the frame calibration or frame adjustment. The timing diagram of such dark current readout for one pixel is explained in conjunction with FIG. 3B below.

Figure 3B:
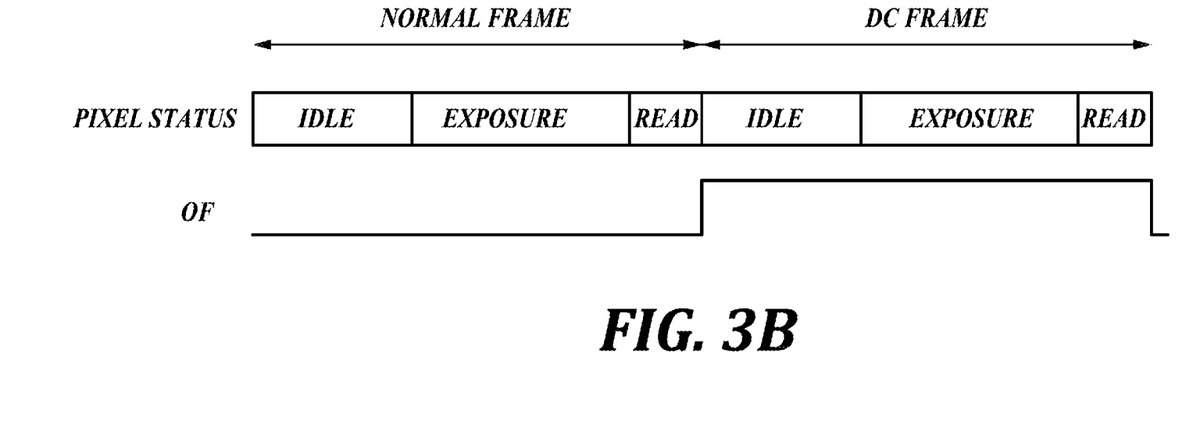
FIG. 3B is a timing diagram illustrating data readout for the pixel shown in FIG. 3A.

FIG. 3B is a timing diagram illustrating data readout for the pixel 203 shown in FIG. 3A. The horizontal axis corresponds to elapsed time. The "pixel status" of the timing diagram indicates pixel operation at a given time (idle, exposure, or read). The lower time diagram (labeled "OF")

indicates an overflow control signal level applied to a gate of the overflow transistor 230. During the acquisition of a regular image frame (or normal frame), the OF transistor is turned off (e.g., an overflow control signal with low signal level applied to the gate of the overflow transistor 230), therefore disconnecting the AVDD voltage from the PD 211 through the overflow transistor 230 allowing the PD 211 to accumulate photogenerated charge upon receiving incident light. During acquisition of a DC frame, the OF is turned on (e.g., an overflow control signal with high signal level is applied to the gate of the overflow transistor 230), therefore draining the photogenerated charges at the PD 211 to the AVDD voltage, so as to disable the PD 211 and to limit the charge accumulation at the FD1 and FD2 to correspond to dark current only or at least to dark current predominantly. Therefore, by the above-described timed operation of the OF transistor, both normal frames and DC frames may be obtained during their respective "read" periods. In embodiments, the DC frame and normal frames are acquired in different exposure periods of the image sensor. In embodiment, the duration for the acquisition of the DC frame and the duration for the acquisition of the normal frame may be the same or different. In embodiment, the duration of exposure period associated with the DC frame is different from the duration of exposure period associated with the normal frame. For example, the duration of exposure period associated with the normal frame may be longer than the duration of exposure period associated with the DC frame.

Figure 4:
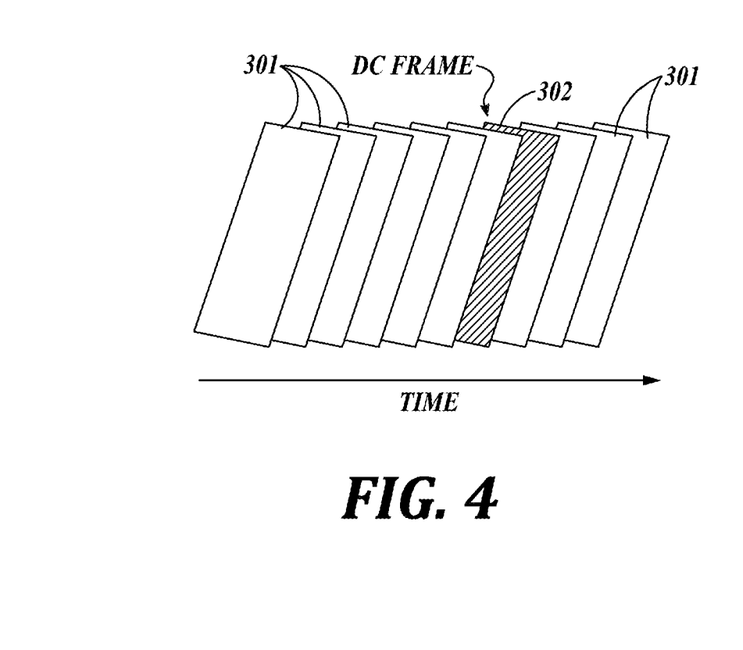
FIG. 4 is a timing diagram illustrating dark current frame subtraction in accordance with an embodiment of the present disclosure.

FIG. 4 is a timing diagram illustrating dark current frame subtraction in accordance with an embodiment of the present disclosure. Numeral 301 designates normal (regular) frames, and numeral 302 designates DC frames. In different embodiments, a DC frame 302 is acquired after a predetermined time lapse (e.g., 1 second), after a certain temperature change (e.g., 1° C. or 5° C.), when scenery changes (e.g., thus changing the overall brightness or exposure to the light of the pixel array) and/or when other external conditions change. Processing of the acquired images is described with reference to FIG. 5 below.

Figure 5:
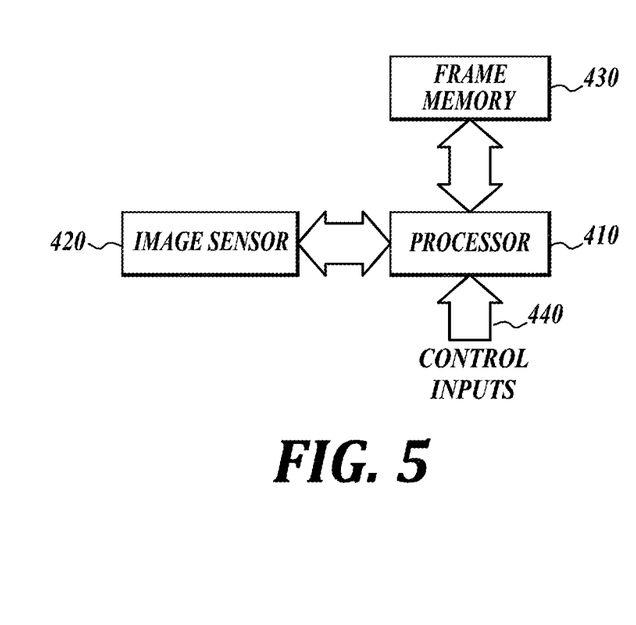
FIG. 5 is an illustrative schematic of a method for dark current frame subtraction in accordance with an embodiment of the present disclosure.

FIG. 5 is an illustrative schematic of dark current frame subtraction in accordance with an embodiment of the present disclosure. The illustrated schematics includes a processor 410, an image sensor 420 (e.g., a CMOS image sensor having LOFIC pixels or a CMOS image sensor having logarithmic pixels for high dynamic range imaging), and a frame memory 430. The image sensor 420 and the frame memory 430 are coupled to the processor 410. In embodiments, the image sensor 420, the frame memory 430, and the processor 410 are integrated into a single device or single chip, for example the image sensor 420, the frame memory 430, and the processor 410 are implemented on an image sensor chip. The processor 410 receives DC frame and image frame from the image sensor 420 and stores the captured DC frame and image frame in the frame memory 430. The DC frame includes a dark current level associated with every pixel in the pixel array of the image sensor 420. The processor 410 may be further configured to subtract the dark current level associated with each pixel from the signal level of each corresponding pixel in an image frame captured after the capture of DC frame yield image frame without contribution of dark current associated with floating diffusion regions. Additionally, the processor 410 may receive one or more control inputs 440 related to the frequency of acquisition of the DC frame (e.g., time, temperature, brightness, etc.). Based on these control inputs, the processor 410 executes subtraction operations, that is, accessing the frame memory 430 for DC frame with DC data for pixels and subtracting the frame memory 430 from the signal data for the normal image frames (e.g., captured image data for pixels) that are in a temporal (time) or situational (temperature, brightness) proximity to the DC frame. In different embodiments, the DC frame may be subtracted from the image signal data captured corresponding to LCG signal, or from both the combined LOFIC image data and FDC (FD1) image data corresponding to the HCG signal.

Figure 6:
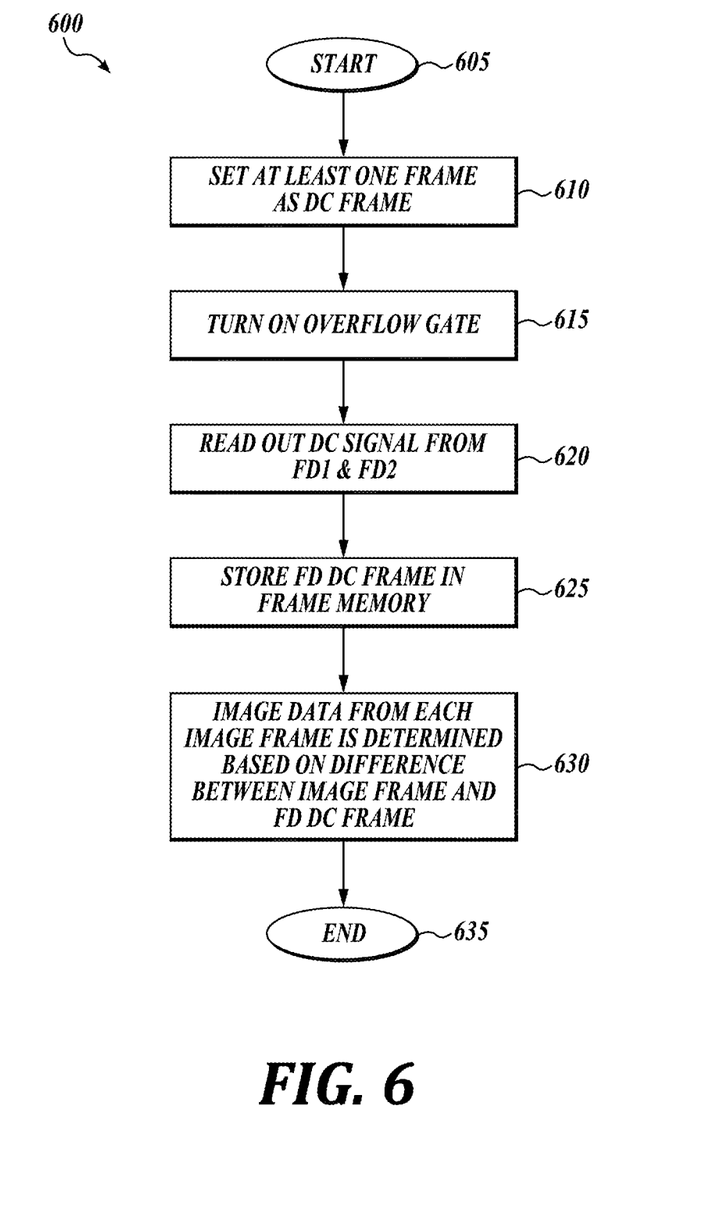
FIG. 6 is a flow chart of dark current frame subtraction in accordance with an embodiment of the present disclosure.

FIG. 6 is a flow chart of a method for dark current frame subtraction in accordance with an embodiment of the present disclosure. FIG. 6 may be a flow chart illustrating dark current calibration method for an image sensor with LOFIC pixels as illustrated in FIG. 3. In different embodiments, the method may include additional steps or may omit some steps illustrated in the flow chart. The method starts in block 605. In block 610, an image frame is designated as a DC frame to represent charges accumulated at the floating diffusions of each pixel in absence of light (e.g., induced by defects in semiconductor substrate). As a result, dark current level is recorded for every pixel. In many embodiments, the exposure time dominates other times (e.g., idle, read) associated with the image capture. Such DC frame designation may be based on the time elapsed from the prior DC frame, temperature changes, brightness changes, or other conditions.

In block 615, an overflow transistor (e.g., overflow transistor OF 230) coupled between a voltage source (e.g., voltage source AVDD) and a photodiode (e.g., photodiode PD 211) is turned to ON state (e.g., receiving an overflow control signal of high signal level at its gate) to form a charge draining path between the voltage source AVDD and the PD 211 and to drain all the charges photogenerated and accumulated in the PD 211 as incident light incident onto the PD 211 to disable PD. As a result, charge accumulation at the FD1 and FD2 is driven by the dark current. A subsequent readout of charges at the FD1 and FD2 that is executed in block 620 therefore represents an accumulation of the dark current at the floating diffusions associated with pixels. At the same time, the OF transistor 230 is still kept in its ON state, therefore assuring that the charges generated by the PD 211 as incident light incident on the PD 211 are drained toward the voltage source AVDD, and not toward the FD1 and/or FD2.

In block 625, charges at the FD1 (e.g., charge at the FDC 219) and the FD2 (e.g., charges at the LOFIC 215) for every pixel are read out and stored as a DC frame in the frame memory (e.g., the frame memory 430 shown in FIG. 5). Restated, a frame contains data representing per-pixel dark current measured at a given point in time, and is referred to as the DC frame at that time point. In block 630, adjusted image data is determined by subtracting the DC frame from the signal readout values for the subsequent acquired normal or regular (image) frame. In many embodiments, the same DC frame is used for multiple normal frames based on time proximity (e.g., normal frames acquired within a predetermined time after the acquisition of the DC frame) or situational proximity (e.g., similar temperature, brightness, etc.). The method may end in block 635.

Figure 7:
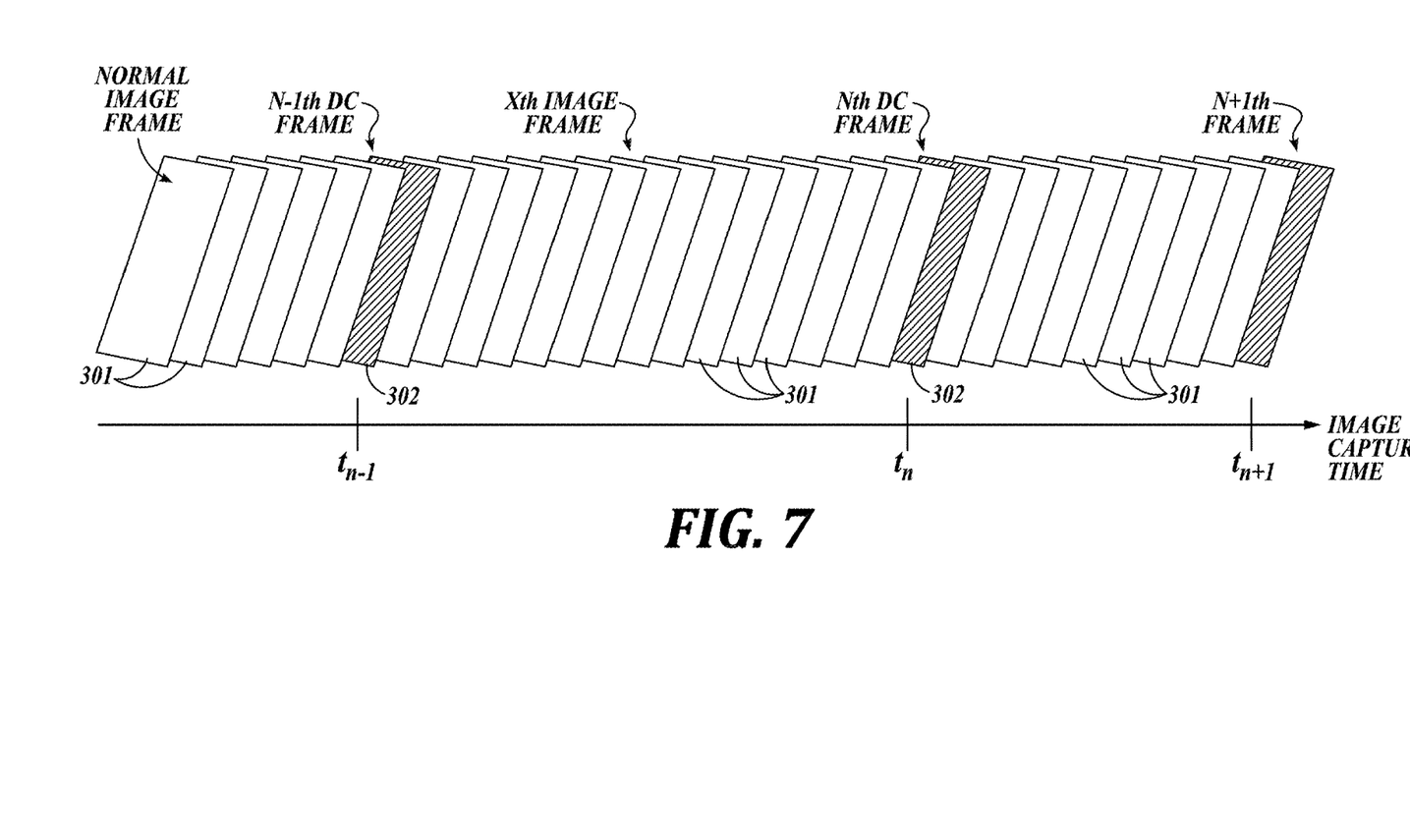
FIG. 7 is a timing diagram illustrating dark current frame subtraction in accordance with an embodiment of the present disclosure.

FIG. 7 is a timing diagram illustrating dark current frame subtraction in accordance with an embodiment of the present disclosure. In the illustrated embodiment, the DC frames N−1, N and N+1 are acquired at times $t_{n-1}$, $t_n$ and $t_{n+1}$, respectively. In some embodiments, the image data of the normal image frames are processed by subtracting a given DC frame from each of the subsequently-acquired frame within a certain number of frames. For example, the signal values for the pixels of the subsequently-acquired Xth image frame 301 may be computed by subtracting the N-1th DC frame from the Xth frame pixel signal values.

In some embodiments, one DC frame may be used for the next N (e.g., 100, 200, etc.) normal image frames. In other embodiments, new DC frame may be acquired at a predetermined time offset (e.g., every 1 second, every 10 seconds, etc.). In other embodiments, a new DC frame may be acquired when an exposure time of a frame changes, for example, from 10 ms to 20 ms. In some embodiments, a change in the operating temperature that exceeds a predetermined threshold (e.g., 1° C., 5° C., etc.) may trigger an acquisition of another DC frame.

Figure 8A:
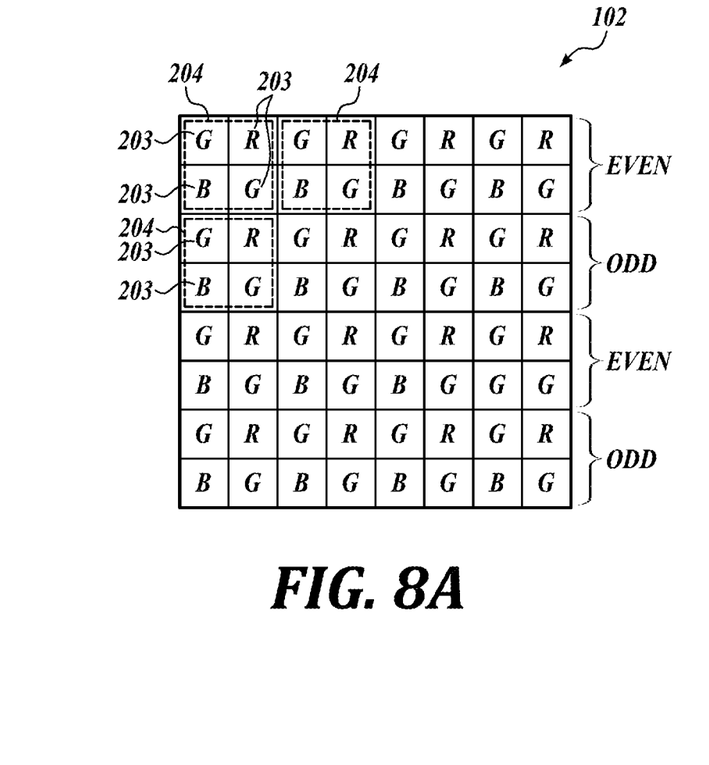
FIGS. 8A and 8B are illustrative schematics of dark current frame subtraction in accordance with embodiments of the present disclosure.
Figure 8B:
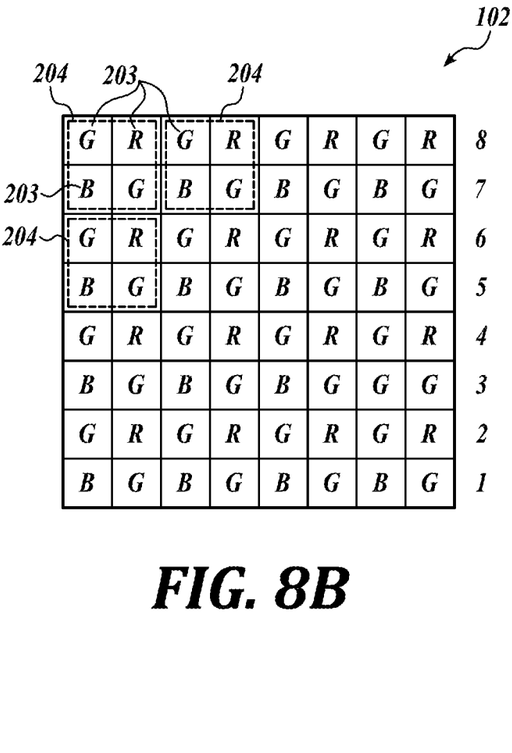

FIGS. 8A and 8B are illustrative schematics of dark current frame subtraction in accordance with another embodiment of the present disclosure. The pixel array 102 includes rows and columns of individual pixels 203. Illustrated pixels 203 can each be configured and arranged for sensing different color or light wavelength. For example, pixels 203 may be arranged and grouped in multiple 2×2 pixel cells 204 following a Bayer pattern that includes two green (G), one red (R) and one blue (B) pixels. In other embodiments, different numbers and color arrangements of the photodiodes in a pixel are also possible without departing from scope of the disclosure. For example, pixels 203 may be arranged and grouped into multiple pixel cells 204 of M×N pixels. For another example, each of multiple pixel cells 204 may include pixels 203 arranged in mosaic pattern of green (G), red (R), blue (B) and infrared (IR) pixels.

FIG. 8A illustrates an embodiment where the pixel array 102 is divided into even and odd rows. During operation, some rows, for example even rows, may serve as DC rows, while other rows, for example odd rows may serve as normal rows. To account for the dark current, the pixel values of the DC row pixels can be subtracted from the pixel values of the normal row pixels for each frame. Such processing of each frame may be well suited when, for example, low resolution frames are adequate for a given purpose. In different embodiments, odd or even columns may be selected to represent the DC pixels, followed by a subtraction process analogous to the one described above.

FIG. 8B illustrates an embodiment where the pixel array 102 is divided into numbered rows. In some embodiments, row "1" of pixels 203 may be a dedicated DC row in the first frame, row "2" of pixels 203 may be a dedicated DC row in the second frame, and so on. Such temporary assignment of the DC rows may improve resolution of the frames in, for example, a video stream in comparison to the embodiment described in conjunction to FIG. 8A above.

Figure 9A:
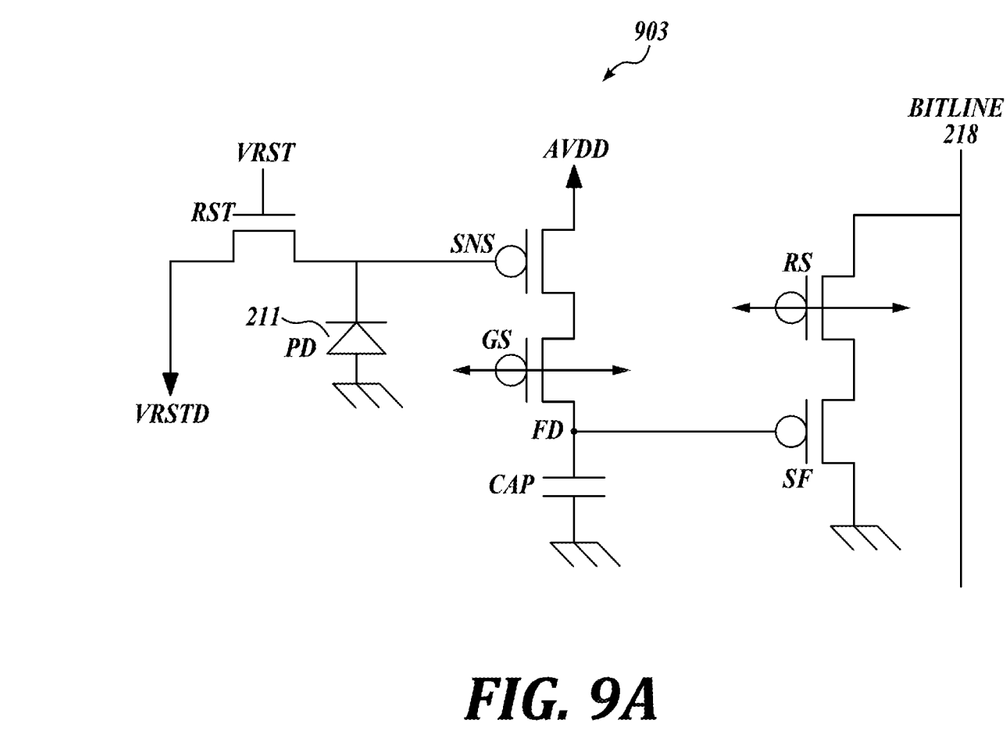
FIG. 9A is an illustrative schematic of a logarithmic pixel in accordance with another embodiment of the present disclosure.

FIG. 9A is an illustrative schematic of a pixel in accordance with another embodiment of the present disclosure. The illustrated pixel 903 may be configured with a logarithmic circuitry and referred to as a logarithmic pixel. A reset transistor RST is controlled to selectively couple a cathode of the photodiode (PD) 211 to a reset drain voltage. In an embodiment, a drain of the transistor RST is coupled to the reset drain voltage and a source of the transistor RST is coupled to a cathode of the PD 211. The anode of the PD 211 is coupled to ground. In an embodiment, the reset drain voltage is a ground. During normal operation (i.e., acquisition of a normal or regular image frame), a transistor RST is first turned on while a reset drain voltage VRSTD of a low signal (e.g., zero voltage or a ground voltage) is applied to a drain of the transistor RST to reset the photodiode 211 during a reset period. Thereafter, the transistor RST is turned off (OFF state), and the PD 211 operates in a forward biasing mode generating a photocurrent in response to the intensity of incident light. The charges generated by the PD 211 control the gate of a storage node (SNS) transistor, therefore controlling the voltage provided to the capacitor CAP during the exposure period. The source follower SF amplifies and outputs a corresponding output voltage based on the voltage at the capacitor CAP. In some embodiments, a global shutter (GS) transistor may be always on, however, in other embodiments, the gate of the GS transistor may be separately controllable.

The gate of the transistor RST may be controlled by a VRST voltage. During the acquisition of normal image frame, the transistor RST is first turned on by the VRST signal to couple PD 211 to reset drain voltage VRSTD, which is set to a zero voltage (ground) to reset PD 211 in a zero-biasing level. Thereafter, during exposure period the transistor RST is then turned off by the VRST signal with VRSTD set to zero voltage (ground), allowing the PD 211 to operate in a forward biasing in corresponding to a photoconduction current generated in response to intensity of incident light. As photoconduction current flow through the PD 211, a voltage is correspondingly built at a gate of transistor SNS, that is then amplified by transistors SNS building a corresponding signal voltage at capacitor CAP, wherein the signal voltage may correspond to the lowest voltage of PD 211. The signal voltage outputted by capacitor CAP is then amplified by a transistor SF and outputted by a transistor RS to bitline 218 during signal read out. During the acquisition of the dark current frame, the transistor RST is set to the ON state (closed) by a VRST signal and the reset drain voltage VRSTD is controlled to provide a reference level e.g., a zero-biasing voltage, therefore forcing the voltage of the PD 211 to the reset drain voltage VRSTD (e.g., a zero voltage) resetting the PD 211 to zero-biasing state so as to disable the PD 211. As a result, the charges stored in the capacitor CAP are subjected to dark current associated with floating diffusions region of pixel 903 only.

According, the read out provides dark current level associated with the respective pixel 903, and the readout frame or DC frame provides dark current readout information for every pixel 903 in the pixel array at the given point of time. The DC frame can be used to calibrate or correct dark current level of subsequent normal image frames through pixel level subtraction, thereby improve imaging performance of the image sensor. In some embodiments, the transistor RST may be referred to as a reset transistor (RST), because it resets the flow of charge from the PD 211. Timing of the normal frame and the dark current frame acquisition is discussed below in conjunction with FIG. 9B.

Figure 9B:
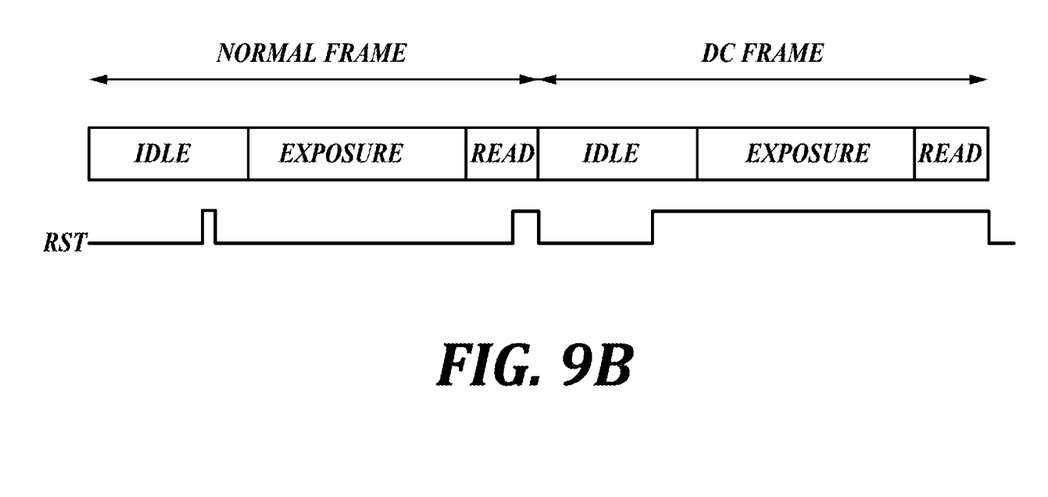
FIG. 9B is a timing diagram illustrating data readout for the pixel shown in FIG. 9A.

FIG. 9B is a timing diagram illustrating data readout for the logarithmic pixel in accordance with embodiments of the present disclosure. In the illustrated diagram, the normal frame is acquired first, followed by the acquisition of the DC frame. Frame acquisition time is divided into the idle, exposure and read times. For the acquisition of the normal image frame, the transistor RST remains open (OFF state) during the exposure time, therefore the photo charges generated by the PD 211 cannot discharge through the transistor RST, but, instead, the photocurrent generated by the accumulated photo charges determines voltage at the capacitor CAP. During the acquisition of the dark current frame, the OF transistor 230 remains closed (ON state), therefore establishing a draining path for discharging the photo charges generated by the PD 211 through the transistor RST into supply voltage VRSTD coupled to the drain of the transistor RST.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method for calibrating dark current for pixels of an image sensor, wherein individual pixel circuits comprise a photodiode (PD) and a transistor coupled to the PD and a source of voltage, wherein the transistor selectively disables the PD from accumulating charges, the method comprising:
   acquiring at least one dark current (DC) frame of a first plurality of pixels of a pixel array of the image sensor, wherein the at least one DC frame contains readings of individual dark currents for the corresponding pixels obtained during a first exposure period of the image sensor when the transistor is turned ON to disable the PD from accumulating photogenerated charges;
   acquiring a plurality of normal frames of a second plurality of pixels of the pixel array of the image sensor, wherein each individual normal frame of the plurality of normal frames contains readings of individual signals for the second plurality of pixels obtained during a respective second exposure period when the transistor is turned OFF to enable the PD to start accumulating photogenerated charges; and
   subtracting the at least one DC frame from each individual normal frame of the plurality of normal frames acquired after the at least one DC frame.

2. The method of claim 1, wherein the first plurality of pixels of the pixel array and the second plurality of pixels of the pixel array are the same.

3. The method of claim 2, wherein the first plurality of pixels of the pixel array and the second plurality of pixels of the pixel array each includes all pixels of the pixel array.

4. The method of claim 1, wherein the first plurality of pixels of the pixel array comprises at least one row of the pixel array and the second plurality of pixels comprises at least another row that is different from the row of the first plurality of pixels.

5. The method of claim 4, wherein the first plurality of pixels is arranged as an odd row of pixels of the pixel array and the second plurality of pixels is arranged as an even row of pixels of the pixel array.

6. The method of claim 5, wherein the first plurality of pixels is arranged in multiple odd rows of pixels of the pixel array and the second plurality of pixels is arranged in multiple even rows of pixels of the pixel array.

7. The method of claim 1, wherein the first plurality of pixels of the pixel array comprises at least one column of the pixel array and the second plurality of pixels comprises at least another column that is different from the at least one column of the first plurality of pixels.

8. The method of claim 1, wherein the first plurality of pixels of the pixel array comprises at least one first row of the pixel array at a first time tn, wherein the first plurality of pixels of the pixel array comprises at least one second row of the pixel array at a second time tn+1, and wherein the first time tn and the second time tn+1 are different.

9. The method of claim 1, wherein the at least one DC frame is a first DC frame, the method further comprising:
   determining a first ambient temperature corresponding to acquisition of the first DC frame;
   determining a second ambient temperature;
   if a difference between the second ambient temperature is the first ambient temperature is greater than a predetermined threshold, acquiring a second DC frame; and
   subtracting the second DC frame from subsequently-acquired normal frames.

10. The method of claim 1, wherein the pixel circuits are linear circuits, and wherein the transistor is an overflow transistor coupling the PD to the source of voltage supplied by a power line and the overflow transistor operatively drain charges from the PD when turned on.

11. The method of claim 1, wherein the pixel circuits are logarithmic circuits, the transistor is a reset transistor, and the source of voltage is a reset drain voltage, wherein the reset transistor resets the PD to the reset drain voltage when turned on.

12. An image sensor, comprising:
   a plurality of pixels arranged in rows and columns of a pixel array, each pixel comprising:
   a photodiode (PD);
   a first floating diffusion (FD1) coupled to the photodiode through a transfer (TX) transistor; and
   a transistor selectively coupling the PD to a source of voltage to disable the PD from accumulating charges in response to an incident light;
   wherein the image sensor is configured to:
   acquire at least one dark current (DC) frame of a first plurality of pixels of the pixel array of the image sensor during a first exposure period of the image sensor when the transistor is turned ON to disable the PD from accumulating photogenerated charges;
   acquire a plurality of normal frames of a second plurality of pixels of the pixel array of the image sensor, wherein each individual normal frame of the plurality of normal frames contains readings of individual signals for the second plurality of pixels obtained during a respective second exposure period when the transistor is turned OFF; and
   subtract the at least one DC frame from each individual normal frame of the plurality of normal frames.

13. The image sensor of claim 12, wherein the transistor is an overflow transistor, wherein the overflow transistor selectively coupled the PD to the source of voltage, and wherein the overflow transistor turns on to drain charges in the PD to the source of voltage.

14. The image sensor of claim 13, further comprising:
   a second floating diffusion (FD2) coupled to the first floating diffusion through a dual floating diffusion transistor; and
   a lateral overflow integrating capacitor (LOFIC) coupled to second floating diffusion (FD2),
   wherein the dual floating diffusion transistor is turned on during the acquisition of the at least one DC frame.

15. The image sensor of claim 12, wherein a circuit of each pixel is a logarithmic circuit, the transistor is a reset transistor coupled to reset the PD to the source of voltage, and the source of voltage is a reset drain voltage.

16. The image sensor of claim 15, wherein the reset drain voltage is a ground voltage.

17. The image sensor of claim 12, further comprising a processor configured to subtract the at least one DC frame from the at least one normal frame.

18. The image sensor of claim 12, wherein the first plurality of pixels of the pixel array and the second plurality of pixels of the pixel array are the same.

19. The image sensor of claim 18, wherein the first plurality of pixels of the pixel array and the second plurality of pixels of the pixel array each includes all pixels of the pixel array.

20. The image sensor of claim 12, wherein the first plurality of pixels of the pixel array comprises at least one row of the pixel array and the second plurality of pixels comprises at least another row that is different from the at least one row of the first plurality of pixels.

21. The image sensor of claim 12, wherein the first plurality of pixels of the pixel array comprises at least one column of the pixel array and the second plurality of pixels comprises at least another column that is different from the at least one column of the first plurality of pixels.

22. The image sensor of claim 12, wherein the first plurality of pixels of the pixel array comprises at least one first row of the pixel array at a first time tn, wherein the first plurality of pixels of the pixel array comprises at least one second row of the pixel array at a second time tn+1, and wherein the first time tn and the second time tn+1 are different.

23. The image sensor of claim 12, wherein the image sensor is further configured to acquire another DC frame if an ambient temperature changes by a predetermined difference after acquiring the at least one DC frame.

24. The image sensor of claim 12, wherein the image sensor is further configured to acquire another DC frame if the second exposure period is greater than a predetermined exposure period after acquiring the at least one DC frame.

25. The image sensor of claim 12, wherein a duration of the first exposure period is different from a duration of the second exposure period.

* * * * *